(12) United States Patent
Farris, III

(10) Patent No.: US 8,207,008 B1
(45) Date of Patent: Jun. 26, 2012

(54) AFFIXING METHOD AND SOLAR DECAL DEVICE USING A THIN FILM PHOTOVOLTAIC

(75) Inventor: Chester A. Farris, III, Yorba Linda, CA (US)

(73) Assignee: Stion Corporation, San Jose, CA (US)

(*) Notice: Subject to any disclaimer, the term of this patent is extended or adjusted under 35 U.S.C. 154(b) by 599 days.

(21) Appl. No.: 12/406,623

(22) Filed: Mar. 18, 2009

Related U.S. Application Data

(60) Provisional application No. 61/085,818, filed on Aug. 1, 2008.

(51) Int. Cl.
*H01L 21/00* (2006.01)

(52) U.S. Cl. .......... 438/73; 136/249; 136/252; 136/256; 438/15; 438/16; 438/17; 438/30; 438/52; 438/53; 438/54; 438/56; 438/57; 438/98; 257/E21.415; 257/52; 257/111; 257/112; 257/529

(58) Field of Classification Search ................ 438/73, 438/15–17, 30, 52–57, 98; 136/249, 252, 136/256; 257/E21.415, 52, 111, 112, 529
See application file for complete search history.

(56) References Cited

U.S. PATENT DOCUMENTS

| | | | |
|---|---|---|---|
| 4,335,266 A | 6/1982 | Mickelsen et al. |
| 4,441,113 A | 4/1984 | Madan |
| 4,461,922 A | 7/1984 | Gay et al. |
| 4,465,575 A | 8/1984 | Love et al. |
| 4,471,155 A | 9/1984 | Mohr et al. |
| 4,499,658 A | 2/1985 | Lewis |
| 4,507,181 A | 3/1985 | Nath et al. |
| 4,517,403 A | 5/1985 | Morel et al. |
| 4,532,372 A | 7/1985 | Nath et al. |
| 4,542,255 A | 9/1985 | Tanner et al. |
| 4,581,108 A | 4/1986 | Kapur et al. |
| 4,589,194 A | 5/1986 | Roy |
| 4,589,918 A | 5/1986 | Nishida |
| 4,598,306 A | 7/1986 | Nath et al. |
| 4,599,154 A | 7/1986 | Bender et al. |

(Continued)

FOREIGN PATENT DOCUMENTS

AU 734676 2/1999

(Continued)

OTHER PUBLICATIONS

Chopra et al., Thin-Film Solar Cells: An Overview, 2004, Progress in Photovoltaics: Research and Applications, 2004, vol. 12, pp. 69-92.

(Continued)

*Primary Examiner* — Jennifer Michener
*Assistant Examiner* — Matthew Martin
(74) *Attorney, Agent, or Firm* — Kilpatrick Townsend & Stockton LLP

(57) ABSTRACT

A solar device is provided, comprising a substrate structure having a surface region, a flexible and conformal material comprising a polymer material affixing the surface region, and one or more solar cells spatially provided by one or more films of materials characterized by a thickness dimension of 25 microns and less and mechanically coupled to the flexible and conformal material. The one or more solar cells have a flexible characteristic. The flexible characteristic maintains each of the solar cells substantially free from any damage or breakage thereto when the one or more films of materials is subjected to bending.

14 Claims, 7 Drawing Sheets

U.S. PATENT DOCUMENTS

| | | | |
|---|---|---|---|
| 4,611,091 A | 9/1986 | Choudary et al. |
| 4,612,411 A | 9/1986 | Wieting et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,724,011 A | 2/1988 | Turner et al. |
| 4,751,149 A | 6/1988 | Vijayakumar et al. |
| 4,775,425 A | 10/1988 | Guha et al. |
| 4,798,660 A | 1/1989 | Emer et al. |
| 4,816,082 A | 3/1989 | Guha et al. |
| 4,914,042 A | 4/1990 | Mahan |
| 4,915,745 A | 4/1990 | Pollock et al. |
| 4,950,615 A | 8/1990 | Basol et al. |
| 4,996,108 A | 2/1991 | Divigalpitiya et al. |
| 5,008,062 A | 4/1991 | Anderson et al. |
| 5,028,274 A | 7/1991 | Basol et al. |
| 5,029,760 A | 7/1991 | Gamblin |
| 5,039,353 A | 8/1991 | Schmitt |
| 5,045,409 A | 9/1991 | Eberspacher et al. |
| 5,069,868 A | 12/1991 | Tokiai et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,180,686 A | 1/1993 | Banerjee et al. |
| 5,211,824 A | 5/1993 | Knapp |
| 5,231,047 A | 7/1993 | Ovshinsky et al. |
| 5,248,345 A | 9/1993 | Sichanugrist et al. |
| 5,261,968 A | 11/1993 | Jordan |
| 5,298,086 A | 3/1994 | Guha et al. |
| 5,336,623 A | 8/1994 | Sichanugrist et al. |
| 5,346,853 A | 9/1994 | Guha et al. |
| 5,474,939 A | 12/1995 | Pollock et al. |
| 5,501,744 A | 3/1996 | Albright et al. |
| 5,512,107 A | 4/1996 | Van den Berg |
| 5,536,333 A | 7/1996 | Foote et al. |
| 5,665,175 A | 9/1997 | Safir |
| 5,977,476 A | 11/1999 | Guha et al. |
| 6,166,319 A | 12/2000 | Matsuyama |
| 6,184,057 B1 * | 2/2001 | Van Andel et al. ............ 438/66 |
| 6,288,415 B1 | 9/2001 | Leong et al. |
| 6,294,274 B1 | 9/2001 | Kawazoe |
| 6,328,871 B1 | 12/2001 | Ding et al. |
| 6,784,492 B1 | 8/2004 | Morishita et al. |
| 6,852,920 B2 | 2/2005 | Sager et al. |
| 6,878,871 B2 | 4/2005 | Scher et al. |
| 7,180,101 B2 | 2/2007 | Ouichi |
| 7,265,037 B2 | 9/2007 | Lee |
| 2002/0063065 A1 | 5/2002 | Sonoda |
| 2003/0075717 A1 | 4/2003 | Kondo et al. |
| 2004/0063320 A1 | 4/2004 | Hollars |
| 2004/0095658 A1 | 5/2004 | Buretea et al. |
| 2004/0110393 A1 | 6/2004 | Munzer et al. |
| 2004/0203220 A1 | 10/2004 | Morooka et al. |
| 2004/0244826 A1 | 12/2004 | Takagi |
| 2004/0245912 A1 | 12/2004 | Thurk et al. |
| 2004/0252488 A1 | 12/2004 | Thurk |
| 2005/0164432 A1 | 7/2005 | Lieber et al. |
| 2005/0287717 A1 | 12/2005 | Heald et al. |
| 2006/0002838 A1 | 1/2006 | Oda |
| 2006/0003585 A1 | 1/2006 | Morooka |
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0053969 A1 | 3/2006 | Harada |
| 2006/0220059 A1 | 10/2006 | Satoh et al. |
| 2007/0006914 A1 | 1/2007 | Lee |
| 2007/0089782 A1 | 4/2007 | Scheuten et al. |
| 2007/0151596 A1 | 7/2007 | Nasuno et al. |
| 2007/0169810 A1 | 7/2007 | Van Duren et al. |
| 2008/0041446 A1 | 2/2008 | Wu et al. |
| 2008/0092945 A1 | 4/2008 | Munteanu et al. |
| 2008/0092953 A1 | 4/2008 | Lee |

FOREIGN PATENT DOCUMENTS

| | | |
|---|---|---|
| DE | 3314197 A1 | 11/1983 |
| DE | 10104726 A1 | 8/2002 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2004/332043 | 11/2004 |
| JP | 2005/311292 | 11/2005 |
| WO | 2005/011002 | 2/2005 |

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $Zn_xCd_{1-x}S$ Nanocomposites in Polymer Matrices and their Photophysical Properties, Langmuir 1998, 14, pp. 4342-4344.

International Search Report and Written Opinion of PCT Application No. PCT/US08/76908, date of mailing Dec. 1, 2008, 8 pages total.

International Search Report and Written Opinion of PCT Application No. PCT/US2008/078001, date of mailing Dec. 2, 2008, 7 pages total.

International Search Report and Written Opinion of PCT Application No. PCT/US08/78019, date of mailing Dec. 8, 2008, 9 pages total.

International Search Report and Written Opinion of PCT Application No. PCT/US08/77965, date of mailing Dec. 9, 2008, 8 pages total.

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

Yang et al., Fabrication and Characteristics of ZnS Nanocrystals/Polymer Composite Doped with Tetraphenylbenzidine Single Layer Structure Light-emitting Diode, Applied Physics Lett. vol. 69 (3), Jul. 15, 1996, pp. 377-379.

Yang et al., Preparation, Characterization and Electroluminescence of ZnS Nanocrystals in a Polymer Matrix, J. Mater. Chem., 1997, 7(1), pp. 131-133.

Yang et al., Electroluminescence from ZnS/CdS Nanocrystals/Polymer Composite, Synthetic Metals 91, (1997) 347-349.

* cited by examiner

AFFIXING METHOD AND SOLAR DECAL DEVICE USING A THIN FILM PHOTOVOLTAIC

CROSS-REFERENCES TO RELATED APPLICATIONS

This application claims priority to U.S. Provisional Patent Application No. 61/085,818, filed Aug. 1, 2008, entitled "AFFIXING METHOD AND SOLAR DECAL DEVICE USING A THIN FILM PHOTOVOLTAIC" by inventor CHESTER A. FARRIS, III, commonly assigned and incorporated by reference herein for all purposes.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

The present invention relates generally to photovoltaic materials and manufacturing methods. More particularly, the present invention provides a conformal solar decal device and method using high efficiency thin film photovoltaic cells. Merely by way of example, the present method and materials include absorber materials made of copper indium disulfide species, copper tin sulfide, iron disulfide, or others for single junction cells or multi junction cells.

From the beginning of time, mankind has been challenged to find ways of harnessing energy. Energy comes in forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable source energy has been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation to electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

According to the present invention, techniques generally related to photovoltaic materials and manufacturing methods are provided. More particularly, the present invention provides a conformal solar decal device and method using high efficiency thin film photovoltaic cells. Merely by way of example, the present method and materials include absorber materials made of copper indium disulfide species, copper tin sulfide, iron disulfide, or others for single junction cells or multi junction cells.

In a specific embodiment, the present invention provides a solar device. The solar device includes a substrate structure having a surface region and a flexible and conformal material comprising a polymer material affixing the surface region. The solar device further includes one or more solar cells spatially provided by one or more films of materials characterized by a thickness dimension of 25 microns and less and mechanically coupled to the flexible and conformal material. The one or more solar cells have a flexible characteristic which maintains each of the solar cells substantially free from any damage or breakage thereto when the one or more films of materials is subjected to bending.

In another specific embodiment, the invention provides a solar decal device affixable to a substrate structure. The solar decal device includes a flexible and conformal material comprising a polymer material capable of detachment from a surface region of a transparent handle substrate. Additionally, the solar decal device includes an interface region provided within a vicinity between the surface region and the flexible and conformal material. Further, the solar decal device includes one or more films of materials coupled to the flexible and conformal material. The one or more films of materials includes an absorber material having a grain size ranging from about 0.5 to about 4 microns. Furthermore, the solar decal device includes one or more solar cells spatially provided by one or more films of materials characterized by a thickness dimension of 25 microns and less and mechanically coupled to the flexible and conformal material. The one or more solar cells have a flexible characteristic which maintains each of the solar cells substantially free from any damage or breakage thereto when the one or more films of materials is subjected to bending.

In an alternative embodiment, the present invention provides a method for manufacturing a solar decal device affixable to a substrate structure. The method includes providing a transparent substrate member having a surface region and forming a flexible and conformal material overlying the surface region with a polymer material capable of detachment from the transparent substrate member. Additionally, the method includes forming an interface region within a vicinity between the surface region of the transparent substrate member and the polymer material. The method further includes forming one or more films of materials mechanically overlying the flexible and conformal material. The one or more films of materials includes an absorber material having a grain size ranging from about 0.5 to about 4 microns. Furthermore, the method includes forming one or more solar cells spatially provided by the one or more films of materials having a thickness dimension of 25 microns and less with a flexible characteristic. The flexible characteristic maintains each of the solar cells substantially free from any damage or breakage thereto when the one or more films of materials is subjected to bending. The method further includes supporting at least the transparent substrate member, the flexible and conformal material, the interface region, and the one or more solar cells to expose a backside region of the transparent substrate member. Moreover, the method includes irradiating the backside region with electromagnetic radiation to selectively release the flexible and conformal material from the surface region of the transparent substrate member to substantially free the one or more solar cells spatially provided by the one or more films of materials mechanically coupled to the flexible and conformal material. In an embodiment, each of the freed one or more solar cells become a solar decal device that is capable of affixing to the substrate structure.

Many benefits are achieved by way of the present invention. For example, the present invention uses starting materials that are commercially available to form a thin film of semiconductor bearing material overlying a suitable substrate member. The thin film of semiconductor bearing material can be further processed to form a semiconductor thin film material of desired characteristics, such as atomic stoichiometry, impurity concentration, carrier concentration, doping, and others. Additionally, the present method uses environmentally friendly materials that are relatively less toxic than other thin-film photovoltaic materials. Depending on the embodiment, one or more of the benefits can be achieved. In a preferred embodiment, the present method uses a conformal and flexible carrier material having an overlying photovoltaic material thereon, which can be applied overlying almost any object of shape and size with a "glove-like" fit. These and other benefits will be described in more detail throughout the present specification and particularly below. Merely by way of example, the present method and materials include absorber materials made of copper indium disulfide species, copper tin sulfide, iron disulfide, or others for single junction cells or multi junction cells.

DETAILED DESCRIPTION OF THE INVENTION

According to the present invention, techniques generally related to photovoltaic materials and manufacturing methods are provided. More particularly, the present invention provides a conformal solar decal device and method using high efficiency thin film photovoltaic cells. Merely by way of example, the present method and materials include absorber materials made of copper indium disulfide species, copper tin sulfide, iron disulfide, or others for single junction cells or multi junction cells.

Figure 1:
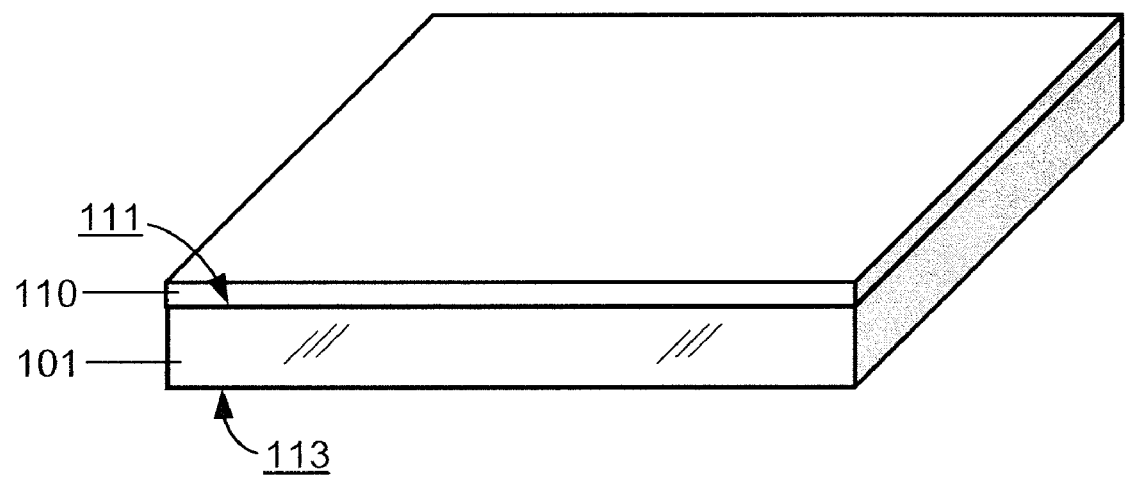
FIG. 1 is a simplified diagram showing a flexible and conformal material formed overlying a transparent substrate according to an embodiment of the present invention.

FIG. 1 is a simplified diagram showing a flexible and conformal material formed overlying a transparent substrate according to an embodiment of the present invention. This diagram is merely an example, which should not unduly limit the scope of the claims herein. As shown, a substrate 101 is provided, which has a surface region 111 and a backside region 113. This substrate 101 is used as a handle substrate. In a preferred embodiment, the substrate 101 is an optically transparent solid selected from a dielectric material, such as glass or quartz, a plastic or polymer material, a metal material, or a semiconductor material, or any composites, and layered materials, and the like. The substrate 100 should be at least transparent for certain predetermined operation lasers or other forms of electromagnetic radiation in terms of wavelength ranges, intended for a programmed laser irradiation process applied from the backside region. In certain alternative embodiments, the transparent substrate 100 is a good thermal conductor for performing a thermal process to replace the as-mentioned laser irradiation process. More details on any of these processes for manufacturing a solar decal device will be found throughout this specification and particularly below.

Referring to FIG. 1, a layer of flexible and conformal material 110 is then formed overlying the surface region 111 of the substrate 101. In one embodiment, the flexible and conformal material 110 is a polymer material coating the surface region 111 in a thickness ranging from 1 microns to about 10 microns. The polymer material can be a polymer such as, for example, a polyimide with a predetermined fluidic characteristics so that it can conformally overlay the whole surface region. In another embodiment, the polymer material includes a polyimide material of 20 microns and less. In some embodiments, the polymer material can be also selected from spin on glass, or others. Of course, there can be other variations, modifications, and alternatives.

The coating of the flexible and conformal material 110 can be performed using extrusion, painting, doctor-blade, spin-on, thermal reflow, spray, dipping, electrostatic bonding, and any combination of these techniques and others. In one embodiment, a first layer of the polyimide material is applied directly onto the surface region 111. Subsequently (may adjusting some processing conditions such as temperature, thickness, density, and curing time, etc), a second layer of the polyimide material is applied. In some case, the second layer of the polymer material may be different from the polyimide material used for the first layer. As a result, the first layer, which is correspondingly next to the surface region, is subjecting to a predetermined releasing process. In particular, the technique results a formation of an interface region between the flexible and conformal material 110 and the surface region 111. Depending on the embodiments, the composition of the first layer polymer can be engineered for best releasing performance for either a chemical release mechanism, a photo-reactive release mechanism, or a thermal release mechanism, a photo-plus-thermal release mechanism using laser irradiation from the backside of the transparent substrate member. In an alternative embodiment, this coating technique is also advantageously applied when coating the polymer material over one application substrate member which is for affixing the detached solar cell. More details on this coating process will be described later. Of course, there coating can also be applied as a tape (e.g., polymer film) or other substrate material.

Figure 1A:
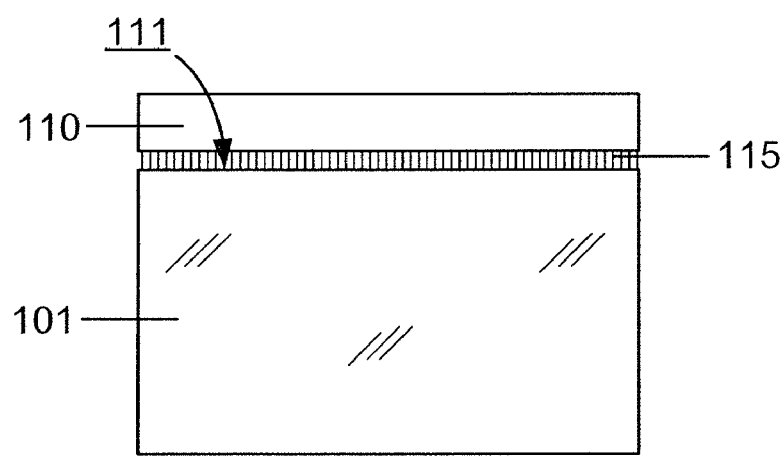
FIG. 1A is a schematic diagram showing detailed interface region between the flexible and conformal material and surface region of the transparent substrate shown in FIG. 1.

FIG. 1A is a schematic diagram showing detailed structure of an interface region between the flexible and conformal material and surface region of the transparent substrate 101 shown in FIG. 1. This diagram is merely an example, which should not unduly limit the scope of the claims herein. As shown, in a microscopic scale the molecules of the polymer material are only bonded to the molecules of the substrate member material by a plurality of Van de Wal's forces. Naturally, Van der Wal's force is a temporary imbalance of electrons in an atom or molecule in which one end is slightly negative than the other, i.e., an effect of a dipole interaction. Van del Wal's bond is rather weak compared to other chemical bondings like hydronic bond, covalence bond, metallic bond, but still strong enough to maintain, after a proper curing process, the polymer material intact overlying the surface region without breaking apart. This provides advantage for performing subsequent deposition of photovoltaic materials and formation of one or more solar cells on the flexible and conformal material. More detail description about the forming one or more films of materials over the flexible and conformal material are shown below.

Figure 2:
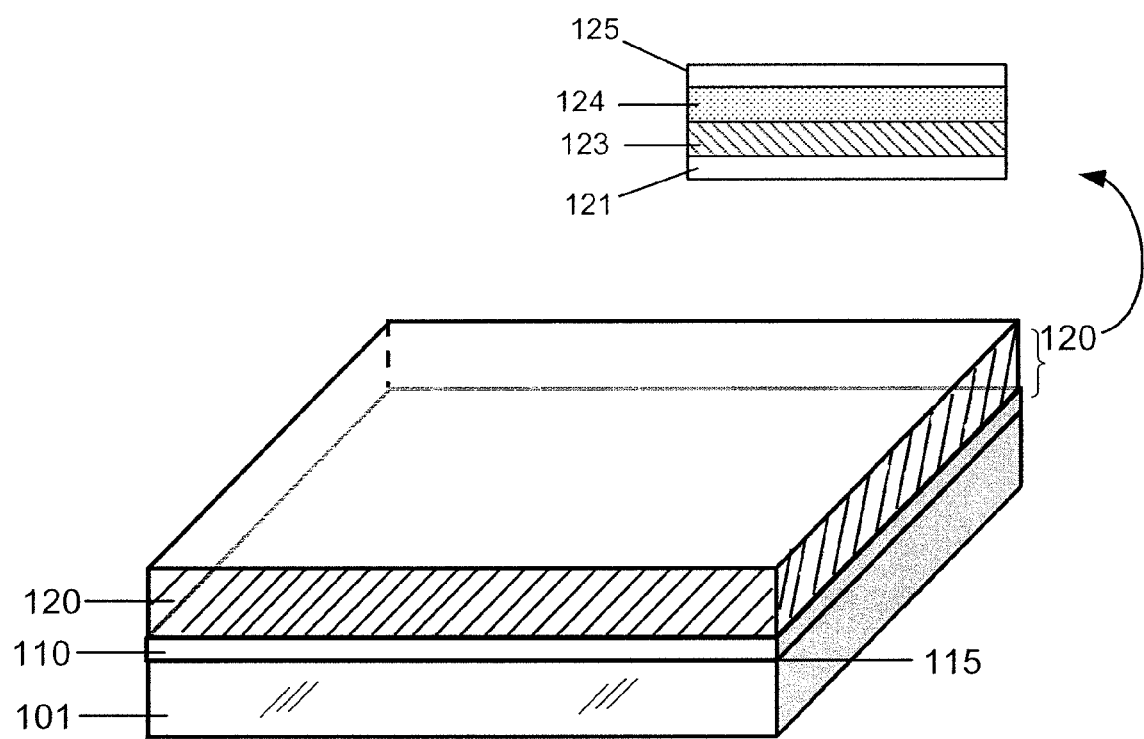
FIG. 2 is a simplified diagram showing one or more films of materials coupled to the flexible and conformal material according to an embodiment of the present invention.

FIG. 2 is a simplified diagram showing one or more films of materials coupled to the flexible and conformal material according to an embodiment of the present invention. This diagram is merely an example, which should not unduly limit the scope of the claims herein. One of ordinary skill in the art would recognize many variations, alternatives, and modifications. As shown, one or more films of materials 120 are formed overlying the flexible and conformal material layer 110. In a specific embodiment, the one or more films of materials 120 comprise a multi-layer thin-film photovoltaic materials as shown in an enlarged cross-sectional view. Depending on the embodiment, the one or more films of materials includes one or more P—N junctions that serve as core elements for forming one or more solar cells. Of course, there can be other alternatives, variations, and modifications for the layer combination structures of the one or more films of materials.

In one example, the one or more films of materials 120 include a first electrode layer 121 which is directly overlying the flexible and conformal material 110. The first electrode layer 121 is made of a metal characterized by a resistivity less than about 10 ohm-cm. The metal material can include gold, silver, nickel, platinum, aluminum, tungsten, molybdenum, a combination of these, or an alloy, among others. In a specific embodiment, the metal material may be deposited using techniques such as sputtering, electroplating, electrochemical deposition and others. In other examples, the first electrode layer 121 can be made of an alternative suitable conductor material such as a carbon based material such as carbon or graphite, or a combination of different conductive materials. Yet alternatively, the first electrode layer 121 may be made of a conductive polymer material, depending on the application. In a specific embodiment, the first electrode layer 121 can be made from an optically transparent material or materials that are light reflecting or light blocking depending on the application. Examples of the optically transparent material can include indium tin oxide (ITO), aluminum doped zinc oxide, fluorine doped tin oxide and others. Of course there can be other variations, modifications, and alternatives.

Referring to the FIG. 2 again, the one or more films of materials 120 include an absorber layer 123 formed overlying the first electrode layer 121, followed by a window layer 124 overlying the absorber layer 123. The absorber layer 123 is of a semiconductor material with P type impurity characteristics which absorbs electromagnetic radiation forming positively charged carriers therein. In a specific embodiment, the absorber layer 123 has a semiconductor bandgap of ranging from about 0.7 eV to about 1.2 eV. In an alternative embodiment, the absorber layer 123 can have a semiconductor bandgap of about 0.5 eV to about 1.2 eV. In a preferred embodiment, the absorber layer 123 can have a bandgap of about 0.5 eV to about 1.0 eV. For example, the absorb layer 123 is made of a composition including cadmium sulfide, a zinc sulfide, zinc selenium (ZnSe), zinc oxide (ZnO), and zinc magnesium oxide (ZnMgO). In a specific embodiment, the absorber layer 123 can be deposited using techniques such as sputtering, spin coating, powder coating, electrochemical deposition, inkjeting, among others, depending on the application. In one embodiment, the absorber layer 123 formed has a plurality of grains that have a size range from about 0.5 microns to about 4 microns. Of course, there can be other variations, modifications, and alternatives.

In another embodiment, the window layer 124 is made of a semiconductor material with N+ impurity type characteristics. A P—N junction is formed between the N+ window layer 124 and the P type absorber layer 123. In a specific implementation, the window layer 124 is characterized by a semiconductor bandgap greater than about 2.5 eV, for example, ranging from 2.5 eV to about 5.5 eV. In a specific embodiment, the window layer 124 comprises a metal chalcogenide semiconductor material and/or other suitable semiconductor material, including a metal sulfide, or a metal oxide, or a metal telluride or a metal selenide material. Alternatively, the window layer 124 can include a metal silicide depending on the application. In another specific embodiment, the window layer 124 can be deposited using techniques such as sputtering, spin coating, doctor blading, powder coating, electrochemical deposition, inkjeting, among others, depending on the application. Of course, there can be other variations, modifications, and alternatives.

In certain embodiments, one or more additional P—N junctions, each including an N+ type window layer substantially similar to the window layer 124 overlying a P type absorb layer substantially similar to the absorber layer 123, can be formed over the P—N junction mentioned earlier. In particular, the film compositional structure and electrical-optical characteristics for each P—N junction can be substantially similar. Alternatively, different P—N junction can have different types of photovoltaic materials. The one or more P—N junctions can be coupled to each other via a coupling layer (not explicitly shown). In one embodiment, the coupling layer can be a conductive material, serving as an electrical middle terminal of one or more solar cells. It also serves as a mechanical bonding material between each pair of P—N junctions. In one embodiment, the coupling layer is a multi-layer film, including a glue layer sandwiched between two conductive electrode layers. One conductive electrode layer below is configured to be the upper electric terminal for a first P—N junction and another conductive electrode layer on top serves a lower electric terminal for the second P—N junction over the first P—N junction. Of course there can be other variations, modifications, and alternatives.

Finally referring to FIG. 2, as shown in the enlarged cross-sectional view, the one or more films of materials 120 include a second electrode layer 125 overlying the window layer 124 (or the N+ type window layer of the up-most P—N junction). The second electrode layer 125 uses a conductor material characterized by a resistivity less than about 10 ohm-cm. The second electrode layer 125 can be made of a suitable material or a combination of materials. In one embodiment, the second electrode layer 125 can be made from a transparent conductive electrode or materials that are light reflecting or light blocking depending on the embodiment. Examples of the optically transparent material can include indium tin oxide (ITO), aluminum doped zinc oxide, fluorine doped tin oxide and others. In a specific embodiment, the second electrode layer 125 may be made from a metal material. The metal material can include gold, silver, nickel, platinum, aluminum, tungsten, molybdenum, a combination of these, or an alloy, among others. In a specific embodiment, the metal material may be deposited using techniques such as sputtering, electroplating, electrochemical deposition and others. Alternatively, the second electrode layer 125 may be made of a carbon based material such as carbon or graphite. Yet alternatively, the second electrode layer 125 may be made of a conductive polymer material, depending on the application.

Figure 3:
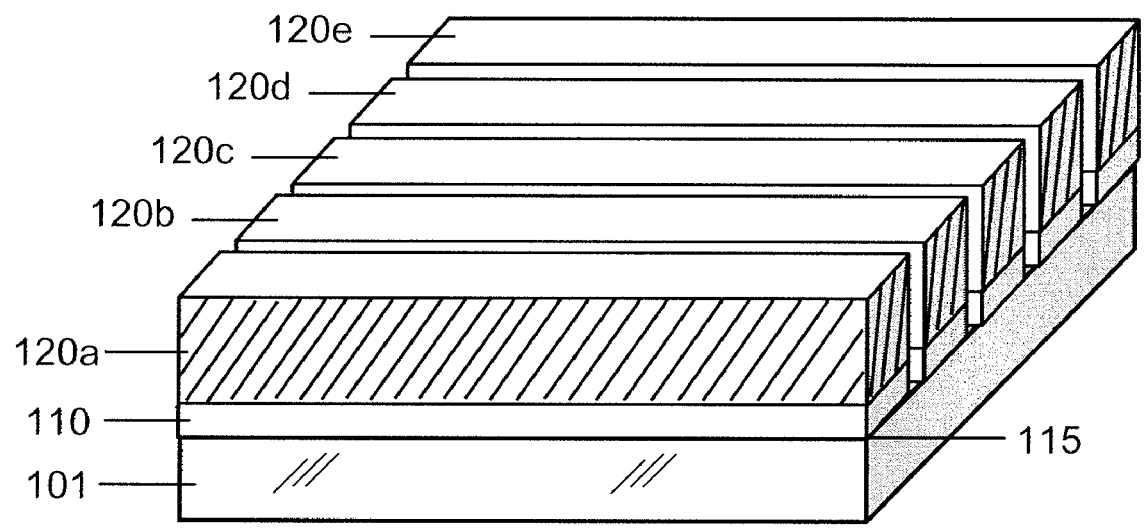
FIG. 3 is a simplified diagram showing one or more solar cells formed in stripes on the transparent substrate according to an embodiment of the present invention.

FIG. 3 is a simplified diagram showing one or more solar cells formed in stripes on the transparent substrate according to an embodiment of the present invention. These diagrams are merely examples, which should not unduly limit the scope of the claims herein. One of ordinary skill in the art would recognize many variations, alternatives, and modifications. FIG. 3 shows the one or more films of materials 120 are separated into a plurality of units 120*a*, 120*b*, 120*c*, 120*d*, and 120*e* on the transparent substrate 101. In particular, each unit can become a solar cell. For example unit 120*a* is in a stripe shape laid over a portion of the flexible and conformal material 110. Depending on the embodiment, certain unit separation processes using laser beams can be performed to divide the one or more films of materials 120. More details about the processes for forming the unit cells using laser techniques can be found in a U.S. Patent Application No. 61/033,406, titled "LASER SEPARATION METHOD FOR MANUFACTURE OF UNIT CELLS FOR THIN FILM PHOTOVOLTAIC MATERIALS" and commonly assigned, and hereby incorporated by reference herein. Subsequently each of the separated unit cells can be processed to form one solar cell. In a specific embodiment, each of the one or more solar cells can be capped by a buffer layer (not explicitly shown). The buffer layer serves for blocking the electrode material diffusing into the respective photovoltaic film in any high temperature processing steps. For example, the buffer layer is characterized by a resistivity greater than about 10 kohm-cm and can be provided using a suitable metal oxide material.

Figure 4:
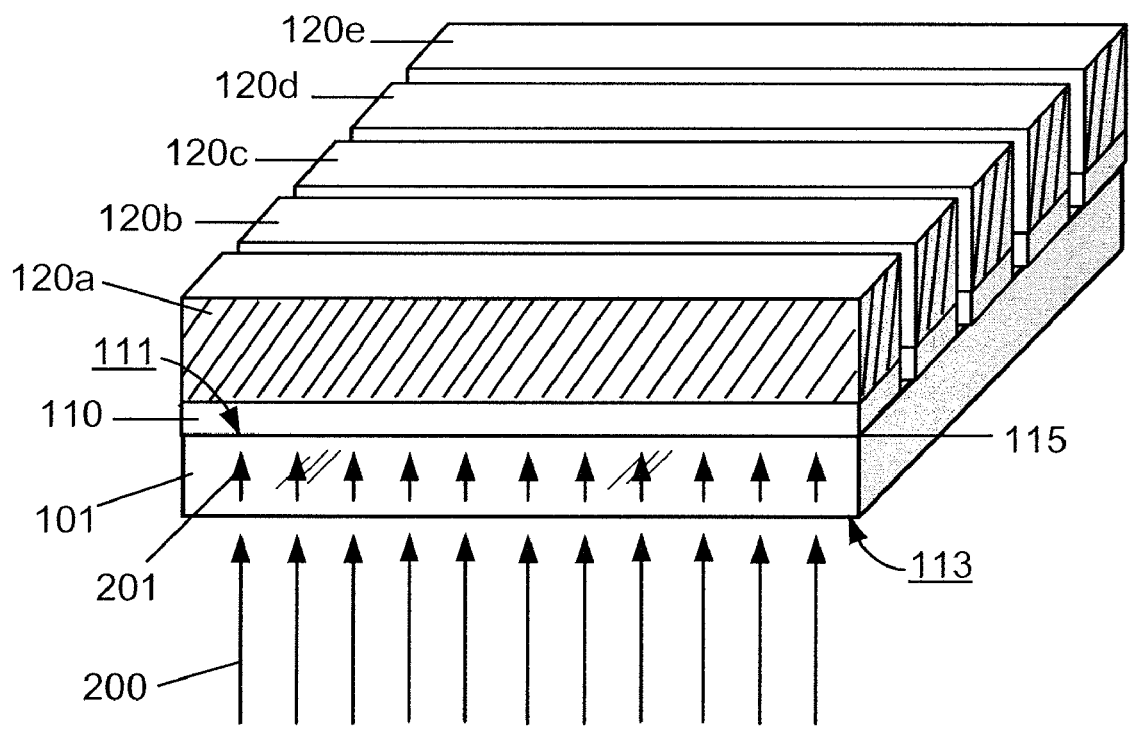
FIG. 4 is a simplified diagram showing a method of releasing the flexible and conformal material according to an embodiment of the present invention.

FIG. 4 is a simplified diagram showing a method of releasing the flexible and conformal material according to an embodiment of the present invention. This diagram is merely an example of a plurality of methods to release the flexible and conformal material from the surface region of the handle substrate, which should not unduly limit the scope of the claims herein. One of ordinary skill in the art would recognize many variations, alternatives, and modifications. For example, chemical releasing or dissolving method, thermal releasing method, or mechanical releasing method may be applied and achieve substantially similar result.

In one implementation shown in FIG. 4, electromagnetic radiation 200 is applied from the backside region 113 of the transparent substrate 101. In one embodiment, optical properties of the transparent substrate 101 has been pre-selected by providing a proper material composition, impurity doping, or external coating to achieve a desired transmission characteristics for the applied electromagnetic radiation 200. As the electromagnetic radiation beams 200 pass through the transparent substrate 101 to irradiate the interface region 115, the absorbed energy from the electromagnetic radiation 200 can break the weak Van del Wal's bonds between molecules of the flexible and conformal material 110 and molecules in the surface region 111. In an alternate embodiment, the electromagnetic radiation induced release is substantially a heat-induced releasing of the one or more solar cells with an ability to decompose and/or release. In particular, as mentioned above, the polyimide material in the flexible and conformal material 110 has been pre-selected to be thermally reactive with the corresponding electromagnetic radiation 200 depending on wavelength and absorbing characteristics. In a specific embodiment, it is the first layer (which is directly coupled to the surface region 111) of the polyimide material being reactive with the electromagnetic radiation 200. In another specific embodiment, the time for irradiating the electromagnetic radiation 200 from the backside region 113 can be controlled so that only the first layer of the polyimide material within the flexible and conformal material 110 is reacted. Resulting from the releasing of the flexible and conformal material 110 from the surface region 111, the one or more solar cells 120*a*, 120*b*, ... formed in earlier processes can be transferred away from a corresponding portion of the transparent substrate 101.

Figure 5A:
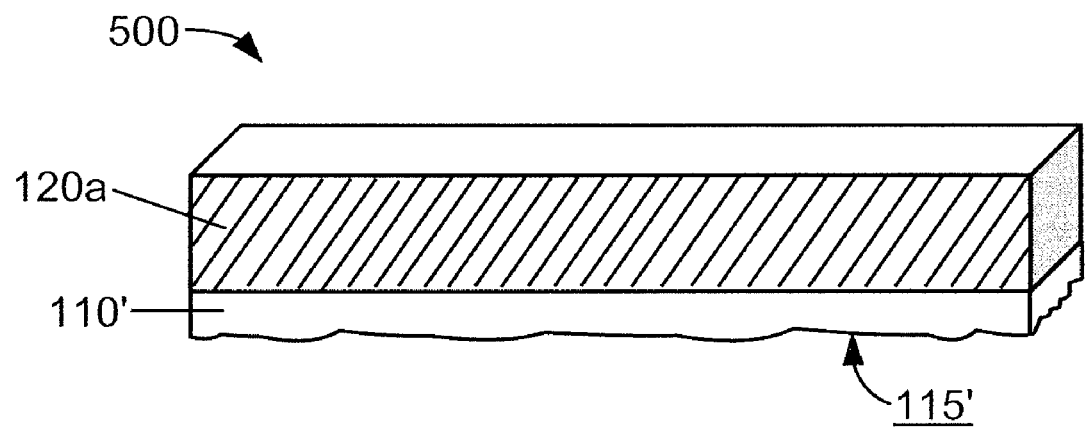
FIG. 5A is a simplified diagram showing one solar cell being transferred away from the transparent substrate according to an embodiment of the present invention.

FIG. 5A is a simplified diagram showing one solar cell being transferred away from the transparent substrate according to an embodiment of the present invention. This diagram is merely an example, which should not unduly limit the scope of the claims herein. One of ordinary skill in the art would recognize many variations, alternatives, and modifications. As shown, one solar cell 120*a* including a remaining portion of flexible and conformal material 110' become a stripe-shaped stand-alone device 500, after transferring away from a corresponding portion of the surface region 111 of the transparent substrate 101. The remaining portion of the flexible and conformal material 110' has a releasing region 115' now exposed. In one embodiment, the remaining portion of the flexible and conformal material 110' serves as a carrier material that can hold the solar cell 120*a*. This results in a formation of a solar decal device 500 which can be re-applied to various different application substrate members.

Figure 5B:
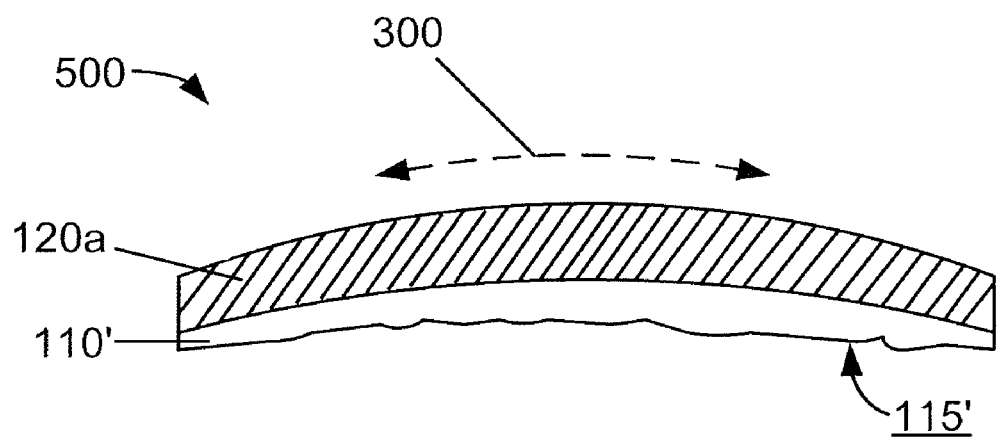
FIG. 5B is a simplified diagram showing a flexible characteristic of solar decal device according to the embodiment of the present invention.

FIG. 5B is a simplified diagram showing a flexible characteristic of solar decal device according to the embodiment of the present invention. This diagram is merely an example, which should not unduly limit the scope of the claims herein. One of ordinary skill in the art would recognize many variations, alternatives, and modifications. As shown, the removed solar decal device 500 including a solar cell 120*a* and the remaining portion of flexible and conformal material 110' as a whole possesses an intrinsic flexible characteristics. The flexible characteristics of the solar decal device is represented by the whole film subjecting to a bending force 300 which causes the solar cell thereof substantially free from any damage or breakage. For example, bending the whole solar decal device 500 with a radius of curvature down to about 1 mm or greater does not cause any damages to the solar cell therein, but can be other dimensions. In one embodiment, the solar decal device 500 as shown is configured to be re-affixed to a plurality of substrates depending on applications. For example, substrate that can be used for affixing the solar decal device includes a portion of a cell phone, a blue tooth device, a laptop, a personal digital assistant, a wireless device, a sensor device, a camera device, a windshield, a window or other surfaces. In an alternative embodiment, the substrate with the affixed solar decal device can be a portion of an automobile, glass, window, laptop computer, handheld PDA device, clothing, table, housing tile, outdoor furniture, defense and/or space applications, aviation, clothing, housing fixtures such as shades/windows, and other objects, which have shaped or planar features. Of course, there are many alternatives, variations, and modifications.

Figure 6A:
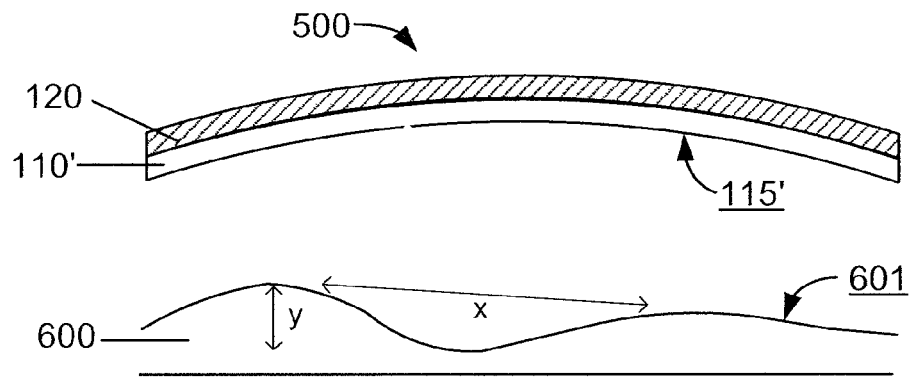
FIGS. 6A-6C are schematic diagrams showing a method of affixing a solar decal device to a substrate structure according to an embodiment of the present invention.
Figure 6B:
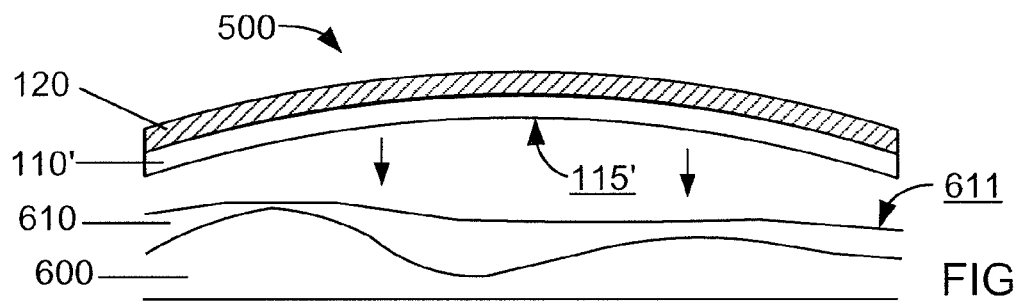
Figure 6C:
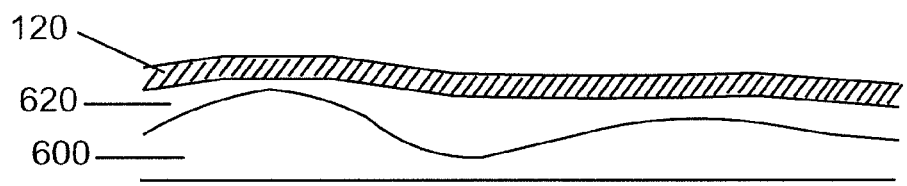

FIGS. 6A-6C are schematic diagrams showing a method of affixing a solar decal device to a substrate structure according to an embodiment of the present invention. This diagram is merely an example, which should not unduly limit the scope of the claims herein. One of ordinary skill in the art would recognize many variations, alternatives, and modifications. As shown in FIG. 6A, a solar decal device 500 including a solar cell 120 and a carrier material 110' is provided. In one embodiment, the solar decal device 500 is made in series of processes described in FIGS. 1-5. The carrier material 110' is a remaining portion of flexible and conformal material 110, which is a kind of polymer material having a thickness ranging from 1 micron to 10 microns with an exposed surface 115'. The solar cell 120 is made of one or more films of photovoltaic materials including at least a first electrode layer, an absorber layer overlying the first electrode layer, a window layer overlying the absorber layer, and a second electrode layer overlying the window layer. The whole film of the solar cell 120 plus the carrier material 110' has flexible characteristics, which is represented a bended form shown in FIG. 6A.

Also shown in FIG. 6A, an application substrate member 600 including a portion of surface 601 is provided. The application substrate member 600 can be a portion of a cell phone, a blue tooth device, a laptop, a personal digital assistant, a wireless device, a sensor device, a camera device, a windshield, a window or other surfaces. The surface 601 can be a portion of an automobile, glass, window, laptop computer, handheld PDA device, clothing, table, housing tile, outdoor furniture, defense and/or space applications, aviation, clothing, housing fixtures such as shades/windows, and other objects, which have shaped or planar features. In one embodiment, the surface 601 has certain roughness features that can be represented by at least a vertical spatial scale y and a lateral spatial scale x and corresponding aspect ratio y/x. In one example, the aspect ratio y/x can be as large as desirable depending on applications.

In order to properly affix the solar decal device 500 onto the surface 601, a layer of flexible and conformal material 610 is applied first. In one embodiment, the layer of flexible and conformal material 610 comprises a polyimide material having a thickness of about 20 microns. The polyimide material has a predetermined fluidic characteristics that can overlays the whole surface 601 in conformal fashion. For example, a spatial feature as large as desirable in the surface 601 can be covered. As a result, a polymer surface 611 becomes much smoother than original substrate surface 601. In another embodiment, the coated flexible and conformal material 610 is configured to bond with the carrier material 110' associated with the solar decal device 500. FIG. 6B shows the solar decal device 500 is to be applied onto the flexible and conformal material 610 coated application substrate 600. The exposed surface 115' of the carrier material 110' is about to engage with the polymer surface 611. In one embodiment, both the carrier material 110' and the pre-coated flexible and conformal material 610 are substantially the same polymer material. Under a certain thermal treatment process, both the both the carrier material 110' and the pre-coated flexible and conformal material 610 are substantially merged into a single layer of flexible and conformal material 620. In one implementation, the single layer of the flexible and conformal material 620 can conformally overlay one or more spatial features on the application substrate having an irregular shape of feature sizes of about four times a thickness of the one or more films of materials for forming the solar cell 120. As shown in FIG. 6C, the solar decal device 500 has been affixed onto the application substrate 600 mediated with a flexible and conformal material 620 therebetween. As pointed out earlier, the solar decal device 500 conformally applied on the application substrate 600 comprises a flexible characteristics with substantially free of any damage of solar cell therein.

Figure 7:
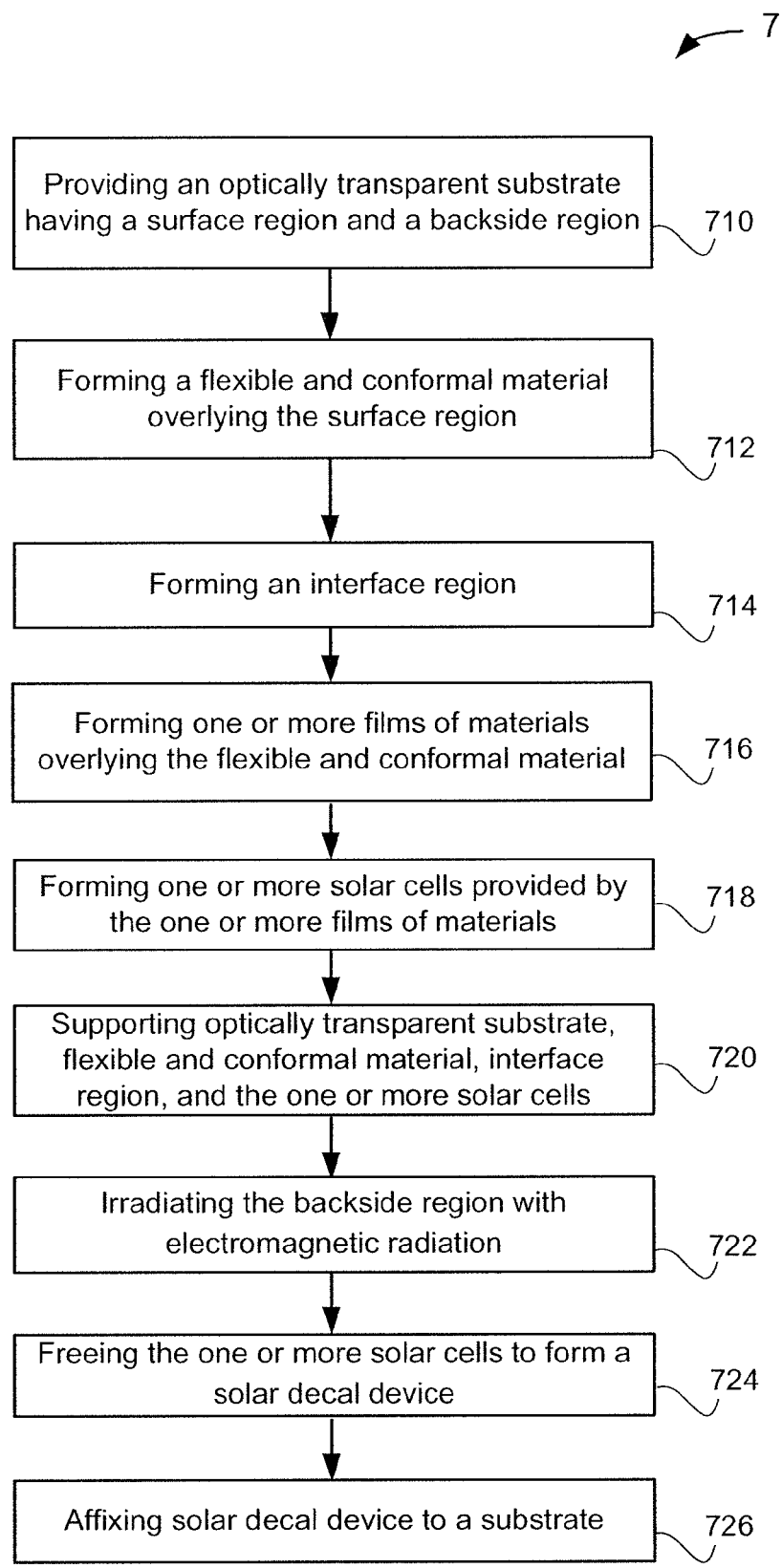
FIG. 7 is a simplified flowchart illustrating a method for manufacturing a solar decal device affixable to a substrate according to an embodiment of the present invention.

FIG. 7 is a simplified flowchart illustrating a method for manufacturing a solar decal device affixable to a substrate according to an embodiment of the present invention. This diagram is merely an example, which should not unduly limit the scope of the claims herein. The method 700 includes the following processes:

1. Process 710 for providing an optical transparent substrate having a surface region and a backside region;
2. Process 712 for forming a flexible and conformal material overlying the surface region;
3. Process 714 for forming an interface region;
4. Process 716 for forming one or more films of materials overlying the flexible and conformal material;
5. Process 718 for forming one or more solar cells provided by the one or more films of materials;
6. Process 720 for supporting optically transparent substrate, the flexible and conformal material, interface region, and the one or more solar cells;
7. Process 722 for irradiating the backside region with electromagnetic radiation;
8 Process 724 for freeing the one or more solar cells to form a solar decal device; and
9 Process 726 for affixing solar decal device to a substrate.

The above sequence of processes provides a method for manufacturing a solar decal device affixable to a substrate structure according to an embodiment of the present invention. Other alternatives can also be provided where some processes are added, one or more processes can be removed, or one or more processes are provided in a different sequence without departing from the scope of the claims herein. Further details of the method can be found throughout the present specification and more particularly below.

At Process 710, an optically transparent substrate is provided. In one embodiment, the optically transparent substrate includes a substrate material selected from a dielectric material, such as glass or quartz, a polymer or plastic material, a metal material, a semiconductor, a composite, or layered material, and the like. In another embodiment, the optically transparent substrate is transparent to an electromagnetic radiation with a predetermined wavelength range. For example, the electromagnetic radiation is a laser beam with wavelength ranging from 400 nm to 700 nm, but can be others. In one implementation, the optically transparent substrate includes a surface region and a backside region, which is substantially the same as the handle substrate 101 shown in FIGS. 1 through 4.

At Process 712, a flexible and conformal material is formed overlying the optically transparent substrate. In one embodiment, the flexible and conformal material is a polymer material with a thickness ranging from 1 micron to 10 microns. In a specific embodiment, the flexible and conformal material is a polyimide material. In one implementation, FIG. 1 has shown an execution of the Process 712 with the flexible and conformal material 110 overlying the transparent substrate 101.

At Process 714, an interface region is formed between the flexible and conformal material and the surface region of the transparent substrate. In particular, the interface region is referred to a spatial area with hetero-molecular interactions between two different types of materials. Unlike inside region within the polymer material or inside region within the substrate material where homo-molecular interaction is dominated by strong covalence bond or hydrogen bond, the interface region between the polymer material and the substrate material is characterized by relatively weak Van del Wal's forces specifically between the molecules of the polymer material and molecules of the substrate material. During the application process, the polymer material of the flexible and conformal material forms a plurality of Van del Wal's forces that are just strong enough to hold onto the transparent substrate and serve as a new base for forming a thin film solar cell. More importantly, this interface region advantageously facilitates the releasing process performed later.

At Process 716, one or more films of materials are formed overlying the flexible and conformal material. In particular, the one or more films of materials are thin film photovoltaic materials configured to form one or more P—N junctions between at least two conducting electrode layers. For example, the one or more films of materials includes a first electrode layer overlying the flexible and conformal material, an absorber layer overlying the first electrode layer, a window layer overlying the absorber layer, and a second electrode layer overlying the window layer. In one specific implementation, the one or more films of materials are films 120 formed according to the illustration of FIG. 2.

At Process 718, one or more solar cells are formed from the one or more films of materials. In one embodiment, the one or more films of materials overlying the flexible and conformal material are separated into one or more units using a laser separation technique developed by the inventor. In another embodiment, the one or more solar cells are characterized by a thin film with a thickness dimension of 25 microns and less. More details about the laser separation processes for forming a plurality of unit cells can be found in a U.S. Patent Application No. 61/033,406, titled "LASER SEPARATION METHOD FOR MANUFACTURE OF UNIT CELLS FOR THIN FILM PHOTOVOLTAIC MATERIALS" and commonly assigned, and hereby incorporated by reference herein. In one implementation, each unit cell is formed in a stripe shape on a portion of the surface region of the transparent substrate. Each unit cell includes a solar cell overlying a portion of flexible and conformal material.

At Process 720, the method 700 includes supporting the optically transparent substrate, flexible and conformal material, interface region, and the one or more solar cells as a whole work piece. In particular, the process includes disposing the whole work piece at a process station where the optically transparent substrate is properly supported so that the backside region is fully exposed to a laser source. The laser source is selected with predetermined pulse rate, wavelength, power range, and beam characteristic that accommodate the optically transparent substrate and capable of interacting with the polymer material at the interface region between the flexible and conformal material and the surface region.

At Process 722, the method 700 further includes irradiating the backside region with an electromagnetic radiation. In specific implementation, the electromagnetic radiation is a laser beam generated by the laser source within the process station. The laser beam is scanned from a portion of the backside region to another portion and transmitted through the optically transparent substrate to reach the interface region. In certain embodiment, the laser beam is a pulsed laser in nature. In other embodiment, the laser beam can be CW laser.

At Process 724, the one or more solar cells are freed from the surface region of the transparent substrate. As the laser energy is absorbed by the molecules within the interface region, the relatively weak Van del Wal's bonds between hetero-molecules at the interface region are substantially broken so that the polymer material becomes detachable. As the laser power and exposure time is properly selected, the film structure and associated device functionality of the one or more solar cells provided by the one or more films of materials above the flexible and conformal material are still substantially free of any damages. In a specific embodiment, for the one or more solar cells have been pre-formatted into stripe shapes, the one or more solar cells can be peeled off one-by-one in stripe shape from one portion of the surface region to another portion. As each solar cell is released from the optically transparent substrate, a portion of flexible and conformal material is still tightly attached, serving as a carrier material to hold the thin film solar cell. In one implementation, the transferred solar cells carried by the remaining portion of flexible and conformal material becomes a solar decal device that is also flexible to some degrees. The flexible solar decal device can be shipped stand-alone and capable of affixing to a variety of application substrate. The flexible characteristic is represented by bending the whole device to a certain radius of curvature which causes substantially free damages or breakage of the solar cells thereto.

At Process 726, the method 700 includes affixing the solar decal device to an application substrate structure. In particular, the application substrate structure is pre-coated with a matching polymer material that is flexible and conformal to corresponding surface features with certain aspect ratio. In one embodiment, the aspect ratio can be as large as desired. In certain implementation, the size of the spatial features on the application substrate structure can be four times larger than the thickness of the thin film solar cell to be affixed. In another embodiment, certain thermal process or chemical process is performed to ensure the bonding between the remaining flexible and conformal material associated with the solar decal device and the matching polymer material. Finally, the solar decal device is affixed with the application substrate, mediated with a flexible and conformal material in between so that the solar cells can be attached to surfaces of the application substrate structure which might be rough to some degrees. For example, the application substrate structure includes a portion of a cell phone, a blue tooth device, a laptop, a personal digital assistant, a wireless device, a sensor device, a camera device, a windshield, a window or other surfaces. In another aspect, the application substrate surface can be a portion of an automobile, glass, window, laptop computer, handheld PDA device, clothing, table, housing tile, outdoor furniture, and other shaped or planar objects, including any of those noted herein, and outside of this specification.

Although the above has been described in terms of specific embodiments, one of ordinary skill in the art would recognize other variations, modifications, and alternatives. As an example, a cell can be made of cadmium telluride (CdTe) material that is a crystalline compound formed from cadmium and tellurium. In a specific embodiment, the CdTe has a zinc blend (cubic) crystal structure. As an example, the CdTe crystalline form is a direct bandgap semiconductor. Depending upon the embodiment, the CdTe is sandwiched with cadmium sulfide to form a pn junction photovoltaic solar cell. In a specific embodiment, a multi junction cell including an upper cell and lower cell. As an example, the upper cell or any cell can made according to High Efficiency Photovoltaic Cell and Manufacturing Method listed under U.S. Ser. No. 61/059,253, commonly assigned, and hereby incorporated for all purposes. In one or more embodiments, the top cell comprises an absorber layer selected from $CuInS_2$, SnS, $Cu(In_2Al)S_2$, $Cu(In_{1-x}, Al_x)S_2$, $Cu(In, Ga)S_2$, or $Cu(In_{1-x}, Ga)S_2$ or other suitable materials. In other specific embodiments, the bottom cell may comprise an absorber layer selected from CIGS, $Cu_2SnS_3$, $FeS_2$, or Ge or others. Additionally, the lower cell can be made of an alternative material that receives any traversing energy through the upper cell. As an example, the lower cell can be made of a suitable material such as silicon, polysilicon, CIGS, and other materials. Of course, there can be other variations, modifications, and alternatives. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing a solar decal device affixable to a substrate structure, the method comprising:
    providing a transparent substrate member having a surface region;
        forming a flexible and conformal material overlying the surface region with a polymer material capable of detachment from the transparent substrate member;
        forming an interface region within a vicinity between the surface region of the transparent substrate member and the polymer material;
        forming one or more films of materials mechanically overlying the flexible and conformal material, the one or more films of materials including an absorber material having a grain size ranging from about 0.5 to about 4 microns;
        forming one or more solar cells spatially provided by the one or more films of materials having a thickness dimension of 25 microns and less with a flexible characteristic, wherein the flexible characteristic maintains each of the solar cells substantially free from any damage or breakage thereto when the one or more films of materials is subjected to bending;
    supporting at least the transparent substrate member, the flexible and conformal material, the interface region, and the one or more solar cells to expose a backside region of the transparent substrate member; and
    irradiating the backside region with electromagnetic radiation to selectively release the flexible and conformal material from the surface region of the transparent substrate member to substantially free the one or more solar cells spatially provided by the one or more films of materials mechanically coupled to the flexible and conformal material.

2. The method of claim 1 wherein providing a transparent substrate member comprises using a substrate material selected from glass, quartz, metal, semiconductor or plastic.

3. The method of claim 2 wherein the substrate material is optically transparent to the electromagnetic radiation.

4. The method of claim 1 wherein the polymer material is configured to absorb thermal energy from the electromagnetic radiation.

5. The method of claim 1 wherein forming the flexible and conformal material comprises coating the surface region with the polymer material ranging from about 1 micron to about 10 microns.

6. The method of claim 1 wherein the flexible and conformal material acts as a carrier material to hold the one or more solar cells.

7. The method of claim 1 wherein the one or more solar cells is configured as a plurality of stripes arranged on and to be released from one portion of the transparent substrate member.

8. The method of claim 7 further comprises affixing the plurality of stripes onto the substrate structure pre-applied with a layer of flexible and conformal material.

9. The method of claim 8 wherein the substrate structure comprises a portion of an automobile, glass, window, laptop computer, handheld PDA device, clothing, table, housing tile, outdoor furniture, and or shaped object.

10. The method of claim 1 wherein one or more films of materials comprises a first electrode layer, an absorber layer overlying the electrode layer, a window layer overlying the absorber layer, and a second electrode layer overlying the window layer.

11. The method of claim 10 wherein the one or more films of materials comprises a thickness less than about 20 microns.

12. The method of claim 1 wherein the thickness of the absorber material is about the grain size thereof.

13. The method of claim 1 wherein one or more solar cells has a thin film absorber material.

14. The method of claim 1 wherein the interface region comprises a plurality of Van der Wal's forces to bond the flexible and conformal material with the surface region, the plurality of Van der Wal's forces being overcome during the detachment of the flexible and conformal material from the surface region.

* * * * *